United States Patent
Depetro et al.

(10) Patent No.: US 6,258,701 B1
(45) Date of Patent: Jul. 10, 2001

(54) PROCESS FOR FORMING INSULATING STRUCTURES FOR INTEGRATED CIRCUITS

(75) Inventors: Riccardo Depetro, Domodossola; Michele Palmieri, Bitonto, both of (IT)

(73) Assignee: STMicroelectronics S,r.l., Agrate Brianza (IT)

( * ) Notice: Subject to any disclaimer, the term of this patent is extended or adjusted under 35 U.S.C. 154(b) by 0 days.

(21) Appl. No.: 09/481,099

(22) Filed: Jan. 11, 2000

(30) Foreign Application Priority Data

Jan. 12, 1999 (IT) ................................. TO99A0009

(51) Int. Cl.[7] .................................................. H01L 21/20
(52) U.S. Cl. ............................................ 438/499; 438/701
(58) Field of Search ................................. 438/499, 40, 42, 438/348, 366, 673, 675, 700, 701, 706, 713

(56) References Cited

U.S. PATENT DOCUMENTS 4,404,576 * 9/1983 Ronen ..................................... 357/23

* cited by examiner

Primary Examiner—David Nelms
Assistant Examiner—Quoc Hoang
(74) Attorney, Agent, or Firm—Theodore E. Galanthay; E. Russell Tarleton; Seed IP Law Group PLLC

(57) ABSTRACT

A process for forming insulating structures for integrated circuits that includes depositing a silicon oxide layer; shaping the silicon oxide layer to form first delimiting walls of the insulating regions substantially perpendicular to the substrate; and shaping the silicon oxide layer to form second delimiting walls inclined with respect to the substrate. The first walls have an angle of between approximately 70° and 110° with respect to the surface of the substrate; the second walls have an angle of between approximately 30° and 70° with respect to the surface of the substrate 11. The first delimiting walls are formed using a first mask and etching anisotropically first portions of the oxide layer; the second delimiting walls are formed using a second mask and carrying out a damage implantation for damaging second portions of the oxide layer and subsequently wet etching the damaged portions.

17 Claims, 3 Drawing Sheets

PROCESS FOR FORMING INSULATING STRUCTURES FOR INTEGRATED CIRCUITS

TECHNICAL FIELD

The present invention pertains to a process for forming insulating structures for integrated circuits and to an integrated circuit thus obtained.

BACKGROUND OF THE INVENTION

As is known, the integration of high voltage devices requires the creation of insulating structures having geometrical characteristics such as to prevent setting-up during operation of the circuit of electric fields of high intensity such as may cause an early breakdown of the insulating structures themselves. In particular, critical situations may occur at sharp edges, for example right angles, where, on account of the reduced radius of curvature, the concentration of charge is greater, and consequently the intensity of the local electric field is greater.

In this connection, reference is made to FIG. 1, in which a wafer 1, shown for convenience only in part, comprises a substrate 2, a thin insulating layer 3 on top of the substrate, an insulating structure 4 formed by a field oxide layer, and a conductive region 5, for example of polycrystalline silicon. The insulating structure 4 is delimited by a wall 6 having a nearly vertical inclination, thereby forming with the substrate 2 a right angle α where, during operation of the device, the intensity of the local electric field is much higher than in the surrounding areas. In a high voltage device, this local peak of electric field may be sufficient to cause early breakdown of the insulating structure 4 also in the case where the average value of the electric field is lower than the values held to be critical.

To solve this problem, high voltage circuits have insulating structures with smaller angles. For example, FIG. 2 shows an insulating structure 7, the physical and geometrical characteristics (in particular, the thickness) of which guarantee the required breakdown value. In particular, the insulating structure 7 has a wall 8 forming an angle β lower than 90° (for example, between 30° and 60°) with respect to the substrate. As a result, given the same operating conditions, the charge density at the angle β is lower than that at the angle α of FIG. 1, and the intensity of the local electric field is lower. In this solution, however, a transition region 7a exists between the insulating structure 7 and the oxide layer 3. As is obvious, the longer the transition region 7a, the smaller the angle β. Consequently, the configuration of FIG. 2 leads to an increase in the area necessary for integration of the integrated circuit.

In particular, this constitutes a limitation in the case where, on the same wafer, high voltage devices and low voltage devices (for example, of the CMOS type) are to be integrated. In fact, whereas high voltage devices require insulating structures with degrading walls to prevent early breakdown, as has been explained above, low voltage devices do not present this problem, while the increase in overall dimensions due to the presence of the transition regions becomes disadvantageous.

Various processes for forming insulating structures of the type described are known.

According to a first solution, starting from a semiconductor material wafer an oxide layer having the desired thickness is deposited. Then a mask is formed, which covers the entire wafer, except for the regions where the degrading walls are to be formed. A damaging implantation is next carried out, where the species implanted is, for example, arsenic. As indicated in J. Gotzlich, H. Ryssel, Journal of the Electrochemical Society, Vol. 12, No. 3, March 1981, and in J. C. North, T. E. McGahan. D. W. Rice, A. C. Adams, IEEE Transactions on Electron Devices, Vol. ED, No. 7, July 1978, the implantation alters the structural characteristics of the oxide. After removal of the mask, wet etching is carried out, during which, on account of the damage, removal of the oxide itself in the horizontal direction rather than in the vertical direction is favored. As a result, the profile that is obtained at the end of the etching step degrades progressively, forming with the underlying layers angles of between approximately 30° and 60°.

With this approach, however, high levels of bulk are obtained, as mentioned above.

A second solution uses the local oxidation (LOCOS) technique. According to this solution, a thin sacrificial oxide layer protecting the substrate is initially formed, and then a silicon nitride layer is deposited. Next, a resist mask is formed, which covers the device active areas and presents windows on the areas where the insulating structures are to be formed. Then, anisotropic etching of the nitride is performed at the windows. After removing the resist mask, a field oxidation is carried out, thus growing field oxide regions in the areas of the substrate that are not covered by the nitride. Finally, the remaining silicon nitride layer is removed.

With the local oxidation technique, the field oxide regions grow in part over the original surface of the substrate and in part beneath, giving rise to intrusions (the so called "bird's beak") having an inclined profile underneath the nitride layer. In this way, clear transitions between the thin oxide layer and the field oxide are avoided; at the same time, the length of the transition regions is reduced.

However, this process presents the drawbacks of being complex and of requiring a high number of fabrication steps. In addition, the oxidation step subjects the wafer to thermal and mechanical fatigue and calls for a preventive implant (for example, of the P-type) to prevent formation of depletion regions underneath the field oxide regions. In fact, the surface of the wafer underneath the insulating structures is impoverished by the field oxidation as an effect of the segregation of doping atoms (for example, boron) by the oxide layer.

A third solution uses the shallow-trench insulating (STI) technique consisting in forming trenches in the substrate and in filling them with silicon oxide. In detail, the regions of the substrate where the insulating structures are to be formed are initially defined through a resist mask laid on the substrate and covering the entire surface thereof, except for these regions. Next, the substrate is etched, for example by reactive ion etching (RIE) until a depth equal to the desired thickness is reached, so forming trenches. Then the mask is removed, and a field oxide layer is deposited over the entire wafer so as to fill the previously dug trenches. Finally, the oxide layer protruding from the trenches is removed through a chemical-mechanical polishing action, the so called chemical-mechanical polishing (CMP) technique.

The described method enables very compact devices to be formed, and hence favors a high integration level; however, it presents the drawback that the walls of the insulating structures have an accentuated slope, with high transition angles. Consequently, the STI technique is very suitable for large scale integration of low voltage devices, whereas it is not suitable for forming high voltage devices

SUMMARY OF THE INVENTION

The present invention provides a process for forming insulating structures that is free from the described drawbacks and in particular helps integration of high voltage components as well as low voltage ones.

According to disclosed embodiments of the present invention, a process for forming insulating structures for integrated circuits and an integrated circuit thus obtained are provided, including a process for forming insulating structures for integrated circuits, comprising forming insulating regions on a surface of substrate of semiconductor material, further comprising forming first walls delimiting said insulating regions, said first walls being substantially perpendicular to said substrate; and forming second walls delimiting said insulating regions, said second walls being inclined with respect to said substrate.

BRIEF DESCRIPTION OF THE DRAWINGS

For a better understanding of the invention, preferred embodiments thereof are now described, purely to provide non-limiting examples and with reference to the attached drawings, wherein.

DETAILED DESCRIPTION OF THE DRAWINGS

Figure 3A:
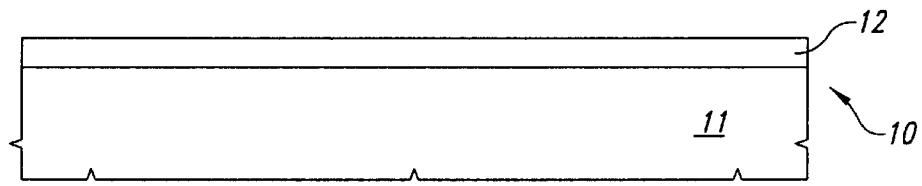
FIGS. 3a–3d show cross-sections through a wafer incorporating insulating structures formed according to the present process in successive steps of fabrication.

Referring to FIG. 3a, a silicon oxide layer 12 is deposited on a wafer 10 comprising a monocrystalline silicon substrate 11.

Subsequently, low voltage active areas are defined. For this purpose, a first resist mask 13 is formed that covers the entire wafer 10, except for windows 14 at the low voltage active areas, for which breakdown problems linked to geometrical discontinuities do not exist.

Figure 3B:
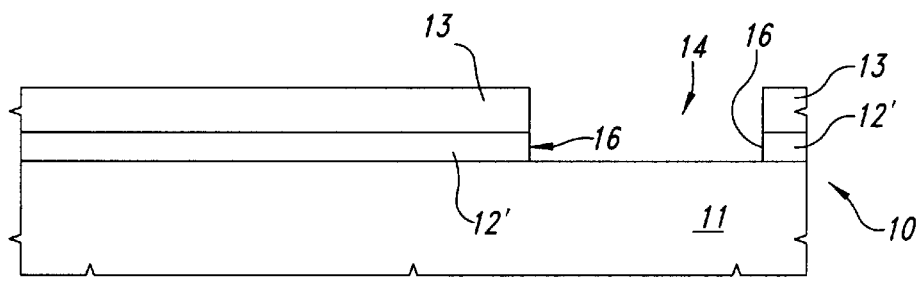

Next, a markedly anisotropic etch of the silicon oxide layer 12 is carried out. In this way, portions of the silicon oxide layer 12 located in the parts corresponding to the windows 14 are removed, and the remaining oxide layer 12' presents walls, hereinafter referred to as vertical walls 16, that are strongly inclined and are nearly vertical (70°–90°, or 90°–110° with respect to the surface of the substrate). In this way, the structure shown in FIG. 3b is obtained.

The first mask 13 is then removed, and a second resist mask 17 is formed, which covers the entire wafer 10, except for windows 18 at the high voltage active areas, in which it is intended to obtain inclined transition regions. Subsequently, a damage implantation is carried out, for example using arsenic, symbolically represented in FIG. 3c by arrows 21. The damaging modifies the structural characteristics of the remaining oxide layer 12' in a known way.

Figure 3C:
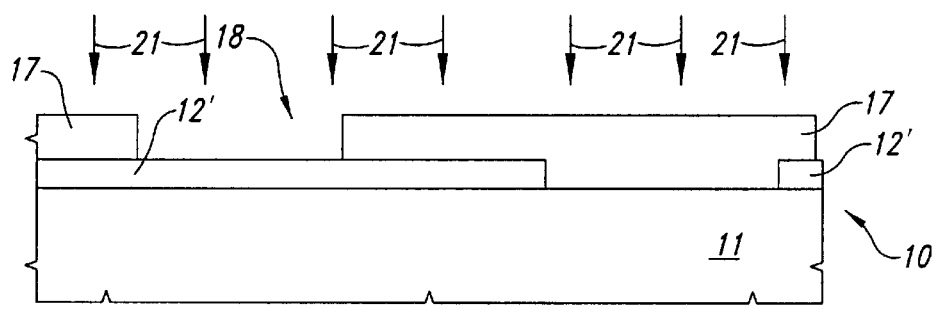
Figure 3D:
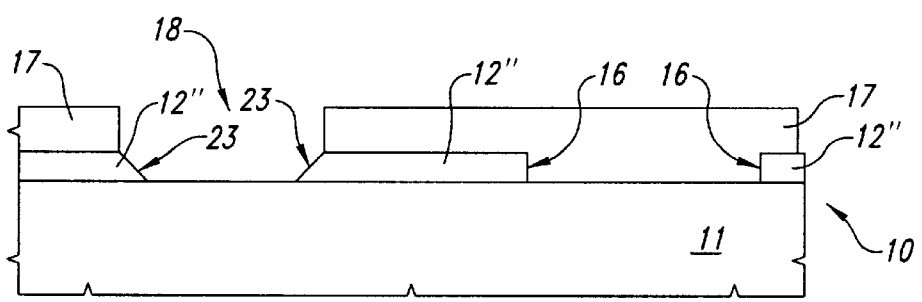

Next, using the same second mask 17, the remaining oxide layer 12' is wet etched. In the conditions indicated, as is known, etching of the remaining oxide layer 12' in the horizontal direction is favored, and the portions of the remaining oxide layer 12' located at the center of the windows 18 of the second mask 17 are removed to a greater extent, in this way, oxide regions 12" are formed, which, at the windows 18, present inclined walls 23, and elsewhere (i.e., where etched using the first mask 13) present the vertical walls 16. The inclined walls 23, in particular, form angles of between approximately 30° and 60° with respect to a plane parallel to the surface of the substrate (FIG. 3d).

In this way, the portion of the wafer 10 delimited by the oxide regions 12" with their vertical walls 16 is suitable for forming high voltage components, whereas the portion of the wafer 10 delimited by the oxide region 12" with their inclined walls 23 is suitable for forming low voltage components.

The described process has the following advantages: first, it enables insulating structures to be formed with walls having different inclinations, according to the type of component to be integrated in the considered wafer portion, so as to optimize the overall dimensions wherever possible, at the same time guaranteeing a high breakdown for the high voltage devices.

Furthermore, as compared to LOCOS techniques, the process eliminates some of the fabrication steps, for example the step of depositing silicon nitride.

In the described process, the oxide layer is deposited instead of being grown thermally, thus avoiding thermal steps that subject the wafer to fatigue. Consequently, the risk of producing defective components is reduced. The use of a deposited oxide layer instead of a thermally grown oxide also avoids the field insulating implant for compensating the depletion during field oxidation.

In addition, high voltage devices can be designed with different transition regions, according to the considered device portion, so optimizing the overall dimensions. This is, for example, evident in the case of a high voltage lateral DMOS device, as highlighted in FIG. 4.

Figure 1:
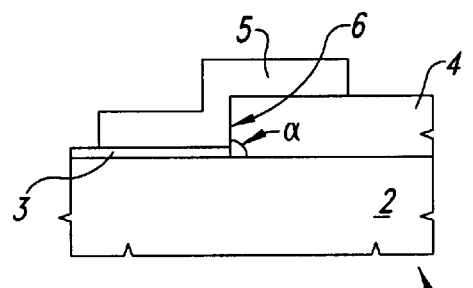
FIG. 1 shows a cross-section through a wafer incorporating an insulating structure of a known type.
Figure 2:
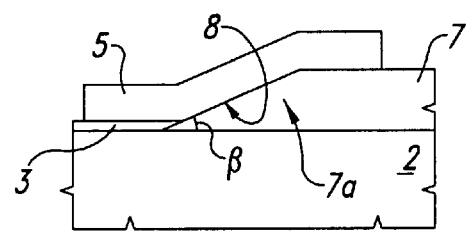
FIG. 2 shows a cross-section through a wafer incorporating a different insulating structure of a known type.
Figure 4:
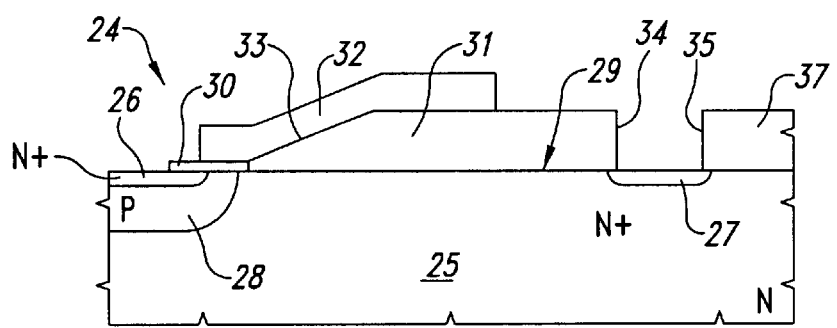
FIG. 4 shows a cross-section through a wafer incorporating a device provided with an insulating structure according to the process of FIGS. 3a–3d.

In detail, FIG. 4 shows a DMOS device 24 comprising an N-type substrate 25 housing a source region 26 and a drain contact region 27, both of the N+ type and facing a surface 29 of the substrate 25. A P-type body region 28 surrounds the source region 26 laterally and below. A gate oxide layer 30 is formed on the surface 29 of the substrate I ., at the body region 28, and joins an insulating structure 31 in such a way as to form a gradual transition. Finally, a gate region 32, for example of polysilicon, extends partly above the gate oxide layer 30 and partly above the insulating structure 31.

Figure 5A:
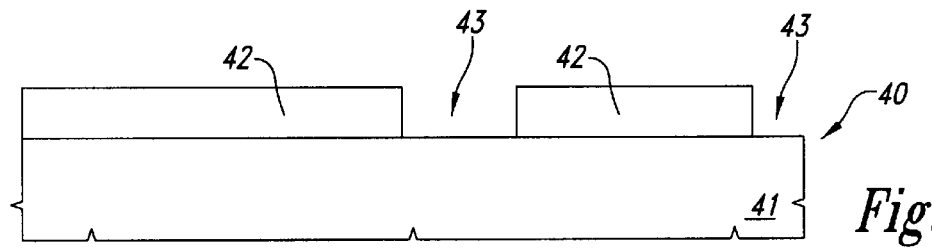
FIGS. 5a–5f show cross-sections through a wafer incorporating insulating structures formed according to a different embodiment of the present invention, in successive fabrication steps.

In the DMOS device 24, the insulating structure 31 presents an inclined wall 33 which extends towards the source region 26 up to the gate oxide layer 30, and a vertical wall 34 which delimits, together with a further vertical wall 35 of a second insulating structure 37, the drain contact region 27. In this way, the insulating structure 31 is able to withstand the high voltages applied to the gate region 32 with respect to the substrate 25 during operation of the device, so reducing to the minimum the bulk in the portion (at the drain contact region 27) where no particular demands as regards breakdown voltages are present, FIG. 5a shows a different embodiment, according to which, starting from a monocrystalline silicon wafer 40 comprises a substrate 41, and a first resist mask 42 formed having windows 43 at the regions of the substrate 41 where low voltage insulating structures are to be obtained.

Figure 5B:
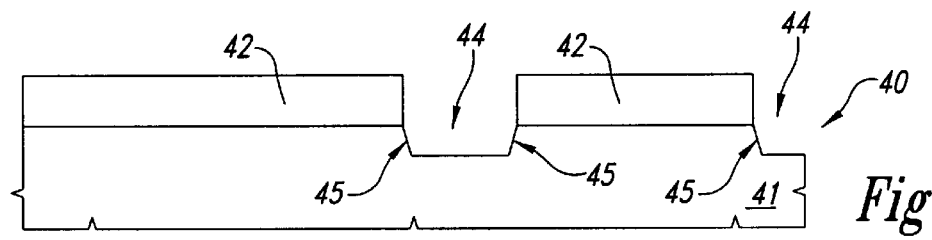
Figure 5C:
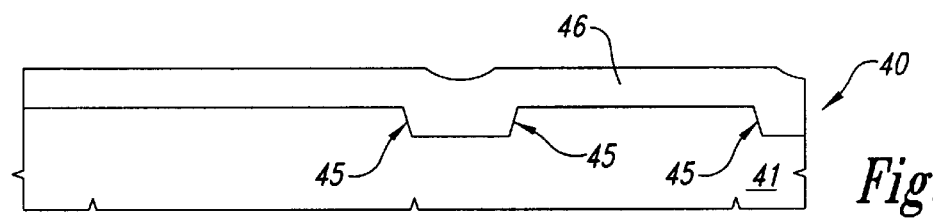

Subsequently, for example by wet etching the substrate 41, at the windows 43 trenches 44 are dug having first walls 45 that are markedly inclined (FIG. 5b). After removing the mask 42, an oxide layer 46 is deposited (FIG. 5c), with at least the same thickness as the depth of the trenches 44 so as to coat the entire substrate 41 and fill the trenches 44.

Figure 5D:
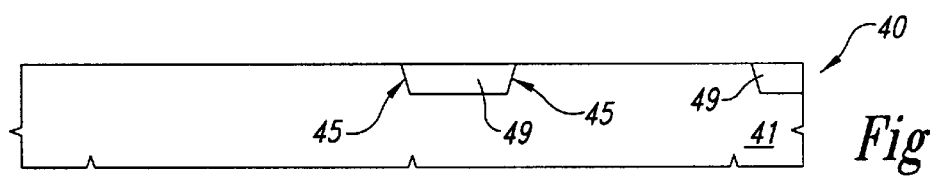

Next, as illustrated in FIG. 5d, the oxide layer 46 protruding from the trenches 44 is removed by means of chemical-mechanical polishing (CMP), and the oxide present in the trenches 44 forms insulating regions 49 having steep walls 45.

Figure 5E:
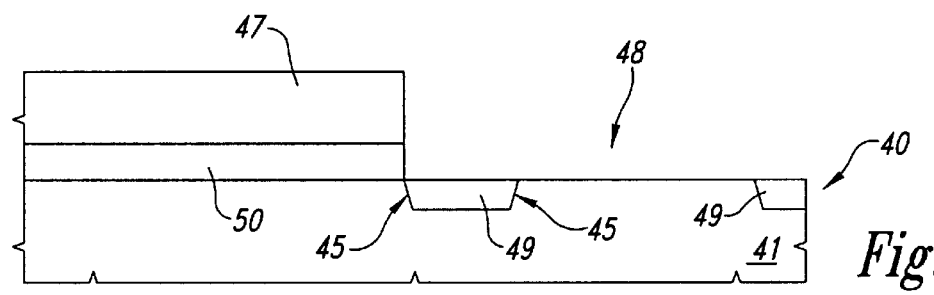

Subsequently, over the entire surface of the wafer 40, now planarized, a second oxide layer is deposited and a second mask 47 is formed, which covers the entire wafer 40, except for windows 48 in the regions where the excess oxide are to be removed (for example, in the wafer portions where low voltage components, such as CMOS devices, are to be formed). Underneath the mask 47, a residual oxide layer 50 is now present (FIG. 5e).

Figure 5F:
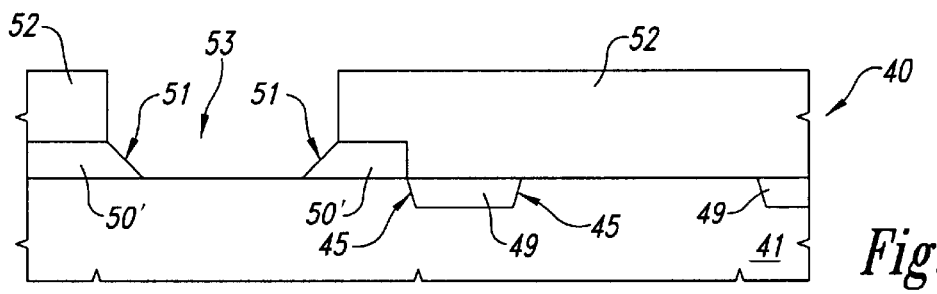

Next, mask 47 is removed, and insulating structures 50' are formed, having walls 51 inclined in a way similar to what has been described with reference to FIGS. 3c and 3d. Specifically, the wafer 40 is again masked with a third resist mask 52 having openings 53 that leave portions of the residual oxide layer 50, where the low voltage components are to be formed, uncovered. Then a damaging implantation is preformed, and the residual oxide layer 50 is wet etched (FIG. 5f).

The process of FIGS. 5a–5f presents the same advantages as indicated above for the process according to FIGS. 3a–3d. In particular, in this case the use of the trench insulating technique at the regions where low voltage devices are formed enables particularly compact structures to be obtained.

Finally, it is evident that modifications and variations may be formed to the integrated circuit described herein, without departing from the scope of the present invention.

What is claimed is:

1. A process for forming insulating structures for integrated circuits, comprising:
    forming insulating regions on a substrate of semiconductor material, further comprising:
        forming first walls delimiting said insulating regions, said first walls being substantially perpendicular to said substrate; and
        forming second walls delimiting said insulating regions, said second walls being inclined with respect to said substrate.

2. The process of claim 1, wherein said first walls form an angle of between approximately 70° and 110° with respect to the surface of said substrate.

3. The process of claim 1 wherein said second walls form an angle of between approximately 30° and 70° with respect to the surface of said substrate.

4. The process of claim 1, wherein said forming the first and second walls further comprises:
    depositing a dielectric material layer on said substrate;
    selectively removing first portions of said dielectric material layer to obtain said first walls; and
    selectively removing second portions of said dielectric material layer to obtain said second walls.

5. The process of claim 4, wherein selectively removing said first portions comprises anisotropically etching said first portions, and said selectively removing said second portions comprises the carrying out of a damaging implantation of said second portions and subsequently wet etching said second portions.

6. The process of claim 5, wherein removing said first portions is carried out using a first mask covering said dielectric material layer and presenting openings above said first portions, and said selectively removing said second portions is carried out using a second mask covering said dielectric material layer and said first walls and having openings above said second portions.

7. The process of claim 1 wherein forming insulating regions comprises:
    forming trenches in said substrate;
    filling said trenches with dielectric material so as to form buried insulating regions in said substrate and having first walls;
    forming surface regions of dielectric material on said substrate;
    selectively removing portions of said surface regions to obtain said second walls.

8. The process of claim 7, wherein filling said trenches comprises depositing a first dielectric material layer having a thickness at least equal to the depth of said trenches and removing any of said first dielectric material layer protruding from said trenches.

9. The process of claim 8 wherein forming trenches is carried out using a first mask; removing said first dielectric material layer is carried out using chemical-mechanical polishing; removing portions of said second dielectric material layer is carried out using a second mask; and the selective removal is carried out using a third mask covering said buried insulating regions and having windows above said portions of said surface regions.

10. The process of claim 7 wherein forming surface regions comprises depositing a second dielectric material layer and removing portions of said second dielectric material layer.

11. The process of claim 7 wherein forming trenches is carried out by wet etching.

12. The process of claim 7 wherein selectively removing comprises performing a damaging implantation of said surface regions and wet etching said portions of said surface regions.

13. The process of claim 7 wherein said dielectric material layers are of silicon oxide.

14. A method for forming an insulating structure for integrated circuits, comprising:
    depositing a first dielectric material layer on a substrate;
    anisotropically etching first portions of the first dielectric material layer using a first mask to form first walls having an angle of approximately 70° to 110° with respect to the substrate;
    implanting a damaging implant in second portions of the dielectric material layer using a second mask; and
    wet etching the second portions to form second walls in the dielectric material layer having an angle of approximately 30° to 70° with respect to the substrate.

15. The method of claim 14 comprising an initial step of forming trenches in said substrate.

16. A method for forming an insulating structure for integrated circuits, comprising:
    forming trenches in said substrate;
    depositing a first layer of dielectric material to substantially fill the trenches and form buried regions of insulating material having first walls;

removing any portion of the first layer of dielectric material that protrudes from the surface of the substrate;

depositing a second layer of dielectric material on the substrate;

implanting a damaging implant in selected portions of the second layer of dielectric material; and wet etching the selected portions of the second layer of dielectric material to form second walls in the second layer of dielectric material having an angle of approximately 30° to 70° with respect to the substrate.

17. The process of claim 16, wherein forming trenches is carried out using a first mask, removing any portions of the first layer of dielectric material comprises using chemical-mechanical polishing; and removing portions of the second layer of dielectric layer is carried out using a second mask.

* * * * *

UNITED STATES PATENT AND TRADEMARK OFFICE
CERTIFICATE OF CORRECTION

PATENT NO.      : 6,258,701 B1
DATED           : July 10, 2001
INVENTOR(S)     : Riccardo Depetro et al.

It is certified that error appears in the above-identified patent and that said Letters Patent is hereby corrected as shown below:

<u>Title page,</u>
Item [73], the assignee should read
-- STMicroelectronics S.r.l. --.

Item [30], the Foreign Priority Application number should read -- TO99A 000009 --.

Signed and Sealed this

Fourteenth Day of January, 2003

JAMES E. ROGAN
*Director of the United States Patent and Trademark Office*